(12) United States Patent
Lerner (10) Patent No.: US 7,818,640 B1
(45) Date of Patent: Oct. 19, 2010

(54) TEST SYSTEM HAVING A MASTER/SLAVE JTAG CONTROLLER

(75) Inventor: Abner Lerner, Rochestown (IE)

(73) Assignee: Cypress Semiconductor Corporation, San Jose, CA (US)

( * ) Notice: Subject to any disclaimer, the term of this patent is extended or adjusted under 35 U.S.C. 154(b) by 17 days.

(21) Appl. No.: 11/235,900

(22) Filed: Sep. 27, 2005

Related U.S. Application Data (60) Provisional application No. 60/621,291, filed on Oct. 22, 2004.

(51) Int. Cl.
*G01R 31/28* (2006.01)
(52) U.S. Cl. ..................................................... 714/726
(58) Field of Classification Search ................. 714/724, 714/726, 727, 729
See application file for complete search history.

(56) References Cited

U.S. PATENT DOCUMENTS

| | | | |
|---|---|---|---|
| 3,896,378 A | 7/1975 | Bedford | |
| 4,558,345 A | 12/1985 | Dwyer et al. | |
| 4,808,844 A | 2/1989 | Ozaki et al. | |
| 4,985,641 A | 1/1991 | Nagayama et al. | |
| 4,990,800 A | 2/1991 | Lee | |
| 5,048,021 A | 9/1991 | Jarwala et al. | |
| 5,119,163 A | 6/1992 | Ishihara et al. | |
| 5,161,124 A | 11/1992 | Love | |
| 5,221,890 A | 6/1993 | Shyu et al. | |
| 5,283,872 A | 2/1994 | Ohnishi | |
| 5,295,110 A | 3/1994 | Sakakibara | |
| 5,303,180 A | 4/1994 | McAdams | |
| 5,325,368 A | 6/1994 | James et al. | |
| 5,353,250 A | 10/1994 | McAdams | |
| 5,355,369 A | 10/1994 | Greenberger et al. | |
| 5,357,626 A * | 10/1994 | Johnson et al. | ............... 714/33 |
| 5,361,003 A | 11/1994 | Roberts | |
| 5,373,470 A | 12/1994 | Jones, Jr. | |
| 5,377,198 A | 12/1994 | Simpson et al. | |
| 5,379,261 A | 1/1995 | Jones, Jr. | |
| 5,379,302 A | 1/1995 | Andrews | |
| 5,412,333 A | 5/1995 | Okunaga | |
| 5,418,470 A | 5/1995 | Dagostino et al. | |
| 5,428,624 A | 6/1995 | Blair et al. | |
| 5,428,626 A | 6/1995 | Frisch et al. | |
| 5,467,304 A | 11/1995 | Uchida et al. | |
| 5,498,972 A | 3/1996 | Haulin | |
| 5,530,391 A | 6/1996 | Bohme et al. | |
| 5,544,115 A | 8/1996 | Ikeda | |
| 5,553,022 A | 9/1996 | Weng et al. | |
| 5,589,783 A | 12/1996 | McClure | |
| 5,594,442 A | 1/1997 | Paulos et al. | |
| 5,625,595 A | 4/1997 | Ikeda | |
| 5,636,227 A | 6/1997 | Segars | |
| 5,642,307 A | 6/1997 | Jernigan | |
| 5,644,261 A | 7/1997 | Frisch et al. | |

(Continued)

OTHER PUBLICATIONS

USPTO Notice of Allowance for U.S. Appl. No. 09/589,919 dated Sep. 28, 2004; 5 pages.

(Continued)

*Primary Examiner*—James C Kerveros (57) ABSTRACT

A test system has a package containing a number of die. There is a JTAG controller for each of the die. There is also master/slave selector input for each of the JTAG controllers. A boundary scan register link connects at least two of the die.

5 Claims, 7 Drawing Sheets

U.S. PATENT DOCUMENTS

| | | | |
|---|---|---|---|
| 5,646,451 A | 7/1997 | Freyman et al. | |
| 5,670,890 A | 9/1997 | Colwell et al. | |
| 5,682,105 A | 10/1997 | Fujima | |
| 5,689,516 A | 11/1997 | Mack et al. | |
| 5,708,773 A | 1/1998 | Jeppesen et al. | |
| 5,727,207 A | 3/1998 | Gates et al. | |
| 5,751,173 A | 5/1998 | McMahon et al. | |
| 5,754,879 A | 5/1998 | Johnston | |
| 5,781,560 A | 7/1998 | Kawano et al. | |
| 5,787,012 A | 7/1998 | Levitt | |
| 5,787,094 A | 7/1998 | Cecchi et al. | |
| 5,822,334 A | 10/1998 | Whittaker et al. | |
| 5,828,824 A | 10/1998 | Swoboda | |
| 5,831,925 A | 11/1998 | Brown et al. | |
| 5,862,152 A | 1/1999 | Handly et al. | |
| 5,870,410 A | 2/1999 | Norman et al. | |
| 5,880,596 A | 3/1999 | White | |
| 5,896,404 A | 4/1999 | Kellogg et al. | |
| 5,920,227 A | 7/1999 | An | |
| 5,926,053 A | 7/1999 | McDermott et al. | |
| 5,982,043 A | 11/1999 | Iwata | |
| 5,983,379 A | 11/1999 | Warren | |
| 5,996,102 A | 11/1999 | Haulin | |
| 6,000,051 A * | 12/1999 | Nadeau-Dostie et al. | 714/727 |
| 6,034,539 A | 3/2000 | Hwang | |
| 6,058,255 A | 5/2000 | Jordan | |
| 6,073,254 A | 6/2000 | Whetsel | |
| 6,111,436 A | 8/2000 | Molnar | |
| 6,111,441 A | 8/2000 | Hartley et al. | |
| 6,115,763 A | 9/2000 | Douskey et al. | |
| 6,161,213 A | 12/2000 | Lofstrom | |
| 6,195,732 B1 | 2/2001 | Adams et al. | |
| 6,195,774 B1 * | 2/2001 | Jacobson | 714/727 |
| 6,225,818 B1 | 5/2001 | Park et al. | |
| 6,259,271 B1 * | 7/2001 | Couts-Martin et al. | 326/40 |
| 6,269,462 B1 | 7/2001 | Shimizu et al. | |
| 6,308,311 B1 | 10/2001 | Carmichael et al. | |
| 6,324,088 B1 | 11/2001 | Keeth et al. | |
| 6,351,809 B1 | 2/2002 | St. Pierre et al. | |
| 6,378,090 B1 | 4/2002 | Bhattacharya | |
| 6,388,464 B1 | 5/2002 | Lacey et al. | |
| 6,425,101 B1 * | 7/2002 | Garreau | 714/727 |
| 6,426,649 B1 | 7/2002 | Fu et al. | |
| 6,430,718 B1 | 8/2002 | Nayak | |
| 6,445,205 B1 | 9/2002 | Fremrot et al. | |
| 6,507,213 B1 | 1/2003 | Dangat | |
| 6,512,395 B1 | 1/2003 | Lacey et al. | |
| 6,525,560 B1 | 2/2003 | Trimberger et al. | |
| 6,539,491 B1 | 3/2003 | Skergan et al. | |
| 6,546,505 B1 | 4/2003 | Swoboda et al. | |
| 6,560,734 B1 | 5/2003 | Whetsel | |
| 6,567,932 B2 | 5/2003 | Edwards et al. | |
| 6,581,190 B1 | 6/2003 | Dixon et al. | |
| 6,587,942 B1 | 7/2003 | Chiang | |
| 6,600,686 B2 | 7/2003 | Huh et al. | |
| 6,651,199 B1 | 11/2003 | Shokouhi | |
| 6,678,850 B2 | 1/2004 | Roy et al. | |
| 6,686,759 B1 * | 2/2004 | Swamy | 324/765 |
| 6,691,267 B1 | 2/2004 | Nguyen et al. | |
| 6,757,844 B1 | 6/2004 | Lulla et al. | |
| 6,775,797 B2 | 8/2004 | Giaume et al. | |
| 6,804,802 B1 | 10/2004 | Lulla et al. | |
| 6,848,068 B1 | 1/2005 | Liu | |
| 6,918,057 B1 | 7/2005 | Brophy et al. | |
| 6,948,147 B1 * | 9/2005 | New et al. | 716/16 |
| 6,990,618 B1 | 1/2006 | Lulla et al. | |
| 7,131,033 B1 | 10/2006 | Roper et al. | |
| 7,181,661 B2 * | 2/2007 | Bybell | 714/724 |
| 7,191,372 B1 * | 3/2007 | Jacobson et al. | 714/724 |
| 7,313,730 B1 * | 12/2007 | Ryser | 714/30 |
| 2001/0044862 A1 | 11/2001 | Mergard et al. | |
| 2002/0194565 A1 | 12/2002 | Arabi | |
| 2004/0006729 A1 * | 1/2004 | Pendurkar | 714/733 |
| 2006/0090109 A1 * | 4/2006 | Bonnet | 714/724 |

OTHER PUBLICATIONS

USPTO Non-Final Rejection for U.S. Appl. No. 09/589,919 dated Apr. 5, 2004; 12 pages.
USPTO Advisory Action for U.S. Appl. No. 09/589,919 dated Feb. 12, 2004; 3 pages.
USPTO Final Rejection for U.S. Appl. No. 09/589,919 dated Nov. 18, 2003; 11 pages.
USPTO Non-Final Rejection for U.S. Appl. No. 09/589,919 dated Apr. 15, 2003; 6 pages.
USPTO Advisory Action for U.S. Appl. No. 09/589,919 dated Jan. 10, 2003; 2 pages.
USPTO Final Rejection for U.S. Appl. No. 09/589,919 dated Oct. 30, 2002; 7 pages.
USPTO Non-Final Rejection for U.S. Appl. No. 09/589,919 dated May 9, 2002; 6 pages.
USPTO Notice of Allowance for U.S. Appl. No. 09/939,076 dated Feb. 22, 2005; 4 pages.
USPTO Non-Final Rejection for U.S. Appl. No. 09/939,076 dated Oct. 19, 2004; 9 pages.
USPTO Non-Final Rejection for U.S. Appl. No. 09/939,076 dated Apr. 13, 2004; 9 pages.
USPTO Final Rejection for U.S. Appl. No. 10/124,543 dated Jul. 14, 2006; 11 pages.
USPTO Final Rejection for U.S. Appl. No. 10/124,543 dated Feb. 13, 2006; 10 pages.
USPTO Non-Final Rejection for U.S. Appl. No. 10/124,543 dated Aug. 10, 2005; 9 pages.
USPTO Non-Final Rejection for U.S. Appl. No. 10/124,543 dated Jun. 2, 2005; 5 pages.
USPTO Notice of Allowance for U.S. Appl. No. 10/176,976 dated Jun. 22, 2006; 4 pages.
USPTO Final Rejection for U.S. Appl. No. 10/176,976 dated Apr. 26, 2006; 12 pages.
USPTO Non-Final Rejection for U.S. Appl. No. 10/176,976 dated Nov. 1, 2005; 11 pages.
USPTO Non-Final Rejection for U.S. Appl. No. 10/176,976 dated Jun. 23, 2005; 9 pages.
USPTO Non-Final Rejection for U.S. Appl. No. 10/176,976 dated Jan. 18, 2005; 10 pages.
USPTO Notice of Allowance for U.S. Appl. No. 10/309,664 dated Sep. 23, 2005; 8 pages.
USPTO Non-Final Rejection for U.S. Appl. No. 10/309,664 dated Apr. 22, 2005; 11 pages.
Microsoft Computer Dictionary, Third Edition, 1997, Microsoft Press, pp. 137-141; 5 pages.
IEEE Standard Test Access Port and Boundary-Scan Architecture, IEEE Std 1149.1-1990, Jun. 17, 1993; pp. 1-127; 139 pages.
Supplement to IEEE Std 1149.1-1990, IEEE Standard Test Access Port and Boundary-Scan Architecture, IEEE Std 1149,1b-1994, Sep. 22, 1994 pp. 1-68; 74 pages.
Play-Hookey.com, Serial-to-Parallel Shift Register, <http://web.archive.org/web/20010821221111/http://www.play-hookey.com/digital/shift-in_register.html>Aug. 21, 2001; 2 pages.
Cho et al., "A Novel Robust and Low Cost Stack Chips Package and Its Thermal Performance," IEEE Transaction on Advanced Packaging, vol. 23, No. 2, May 2000, pp. 257-265; 10 pages.
Nishikawa et al., "A Compact V-Band 3-0 MMIC Single-Chip Down-Converter Using Photosensitive BCB Dielectric Film," IEEE Transactions on Mircowave Theory and Techniques, vol. 47, No. 12, Dec. 1999, pp. 2512-2518; 7 pages.
Kertis et al., "A 6.8ns ECL I/O BiCMOS Configurable SRAM," 1990 Symposium on VLSI Circuits, pp. 39-40; 2 pages.
"IEEE Standard Test Access Port and Boundary-Scan Architecture," IEEE Std, 1149.1-2001, Jul. 23, 2001; pp. 1-200; 208 pages.
Intellectual Scan Tools, JTAG & other IEEE Standards Information, 2000 Intellitech Corporation [retrieved on Sep. 14, 2002] <http://www.intellitech.com/resources/IEEEstandardsandjtag.htinl>; 3 pages.

BSD Compiler Boundary Scan Synthesis, SYNOPSYS Inc., 1999; 2 pages.

JTAG (IEEE 1149.1/P1149.4) Tutorial Introductory: 1997 TI Test Symposium; 46 pages.

USPTO Notice of Allowance for U.S. Appl. No. 09/599,586 dated Jun. 1, 2004; 4 pages.

USPTO Advisory Action for U.S. Appl. No. 09/599,586 dated Dec. 3, 2003; 2 pages.

USPTO Final Rejection for U.S. Appl. No. 09/599,586 dated Sep. 3, 2003; 5 pages.

USPTO Non-Final Rejection for U.S. Appl. No. 09/599,586 dated Mar. 27, 2003; 8 pages.

USPTO Notice of Allowance for U.S. Appl. No. 09/696,714 dated Dec. 1, 2003; 1 page.

USPTO Non-Final Rejection for U.S. Appl. No. 09/696,714 dated Jul. 29, 2003; 5 pages.

USPTO Notice of Allowance for U.S. Appl. No. 09/809,242 dated Aug. 2, 2002; 5 pages.

USPTO Final Rejection for U.S. Appl. No. 091809,242 dated Apr. 30, 2002; 5 pages.

USPTO Non-Final Rejection for U.S. Appl. No. 09/809,242 dated Dec. 3, 2001; 4 pages.

USPTO Notice of Allowance for U.S. Appl. No. 09/475,808 dated Nov. 6, 2001; 3 pages.

USPTO Non-Final Rejection for U.S. Appl. No. 09/475,808 dated Jun. 6, 2001; 6 pages.

USPTO Notice of Allowance for U.S. Appl. No. 10/024,093 dated Sep. 10, 2002; 3 pages.

"IEEE Std 1149.1-1990: IEEE Standard Test Access Port and Boundary-Scan Architecture," IEEE, May 1990; 139 pages.

"IEEE Std 1149.1b-1994: Supplement to IEEE Std 1149.1-1990, IEEE Standard Test Access Port and Boundary-Scan Architecture," IEEE, Sep. 1994, Copywritten1995; 74 pages.

"Vertex 2.5V Field Programmable Gate Arrays," Xilinx, Apr. 2001, pp. 1-20; 20 pages.

Kaptanoglu et al., "A New High Density and Very Low Cost Reprogrammable FPGA Architecture," Feb. 1999, 10 pages.

"XC4000XLA/XV Field Programmable Gate Arrays," Xilinx, Oct. 1999, pp. 6-157 to 6-170; 14 pages.

"Mach 5 CPLD Family—Fifth Generation Mach Architecture," Lattice Semiconductor Corp., Revision 1, Sep. 2000, pp. 1-48; 48 pages.

"Integrating Product-Term Logic in APEX 20K Devices," Altera, Apr. 1999, Version 1.0, pp. 1-12; 12 pages.

"Flex 10K Embedded Programmable Logic Device Family," Altera, Mar. 2001, Version 4.1, pp. 1-128; 128 pages.

"Max 9000 Programmable Logic Device Family," Altera, Jul. 1999, Version 6.01, pp. 1-40; 41 pages.

"Max 7000 Programmable Logic Device Family," Altera, Mar. 2001, Version 6.1, pp. 1-62; 62 pages.

"Boundary Scan Descriptive Language for Non-JTAG Components," IBM Technical Disclosure Bulletin, vol. 36, Issue 10, pp. 599-600, Oct. 1993; 3 pages.

"XC9500XV Family High-Performance CPLD," Xilinx, Jan. 2001, pp. 1-18; 18 pages.

"Spartan and Spartan-XL Families Field Programmable Gate Arrays," Xilinx, Mar. 2000, pp. 4-1 to 4-66; 66 pages.

"Flex 8000 Programmable Logic Device Family," Altera, Jun. 1999, Version 10.01, pp. 349-410; 62 pages.

"Apex II Programmable Logic Device Family," Altera, May 2001, Version 1.1, pp. 1-96; 96 pages.

"XC4000E and XC4000X Series Field Programmable Gate Arrays," Xilinx, Version 1.6, May 1999, pp. 6-5 to 6-72; 68 pages.

Agrawal et al., "An Innovative, Segmented High Performance FPGA Family with Variable-Grain-Architecture and Wide-Gating Functions," Feb. 1999, pp. 17-26; 10 pages.

Heile et al., "Hybrid Product Term and LUT Based Architecture Using Embedded Memory Blocks," Proceedings of FPGA 1999 Conference, Feb. 1999, pp. 13-16; 4 pages.

"Coolrunner XPLA3 CPLD," Xilinx Advance Product Specification DS012 (v1.4), Apr. 2001, pp. 1-10; 10 pages.

* cited by examiner

FIG. 9

TEST SYSTEM HAVING A MASTER/SLAVE JTAG CONTROLLER

RELATED APPLICATIONS

The present invention claims priority on provisional patent application Ser. No. 60/621,291, filed on Oct. 22, 2004, entitled "Master/Slave JTAG Architecture for Multi-Die Configuration" and is hereby incorporated by reference.

FIELD OF THE INVENTION

The present invention relates generally to the field of electronic circuits and more particularly to a test system for electronic circuits.

BACKGROUND OF THE INVENTION

Figure 1:
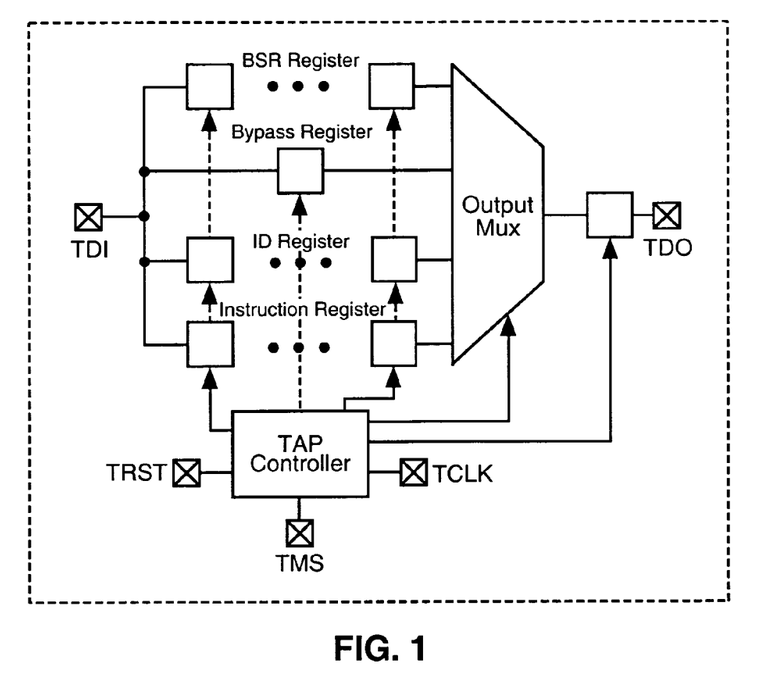
FIG. 1 is a block diagram of a conventional device with JTAG circuitry.

The Joint Test Access Group (JTAG) IEEE-1149.1 interface (specification available from www.ieee.org) is widely used for boundary-scan testing and in-system-programming of devices. The JTAG interface is ubiquitous in modern complex ICs to allow for a simple but effective way to test devices at manufacturing time as well as when the parts are assembled in the target system. A block diagram of conventional JTAG circuitry is shown in FIG. 1.

The conventional JTAG data path includes a series of registers placed from the data in (TDI) to the data out (TDO) pin. The clocking, loading and selection of the registers is handled by the test access port (TAP) controller, which is driven by the external pins TRST, TMS and TCLK.

Figure 2:
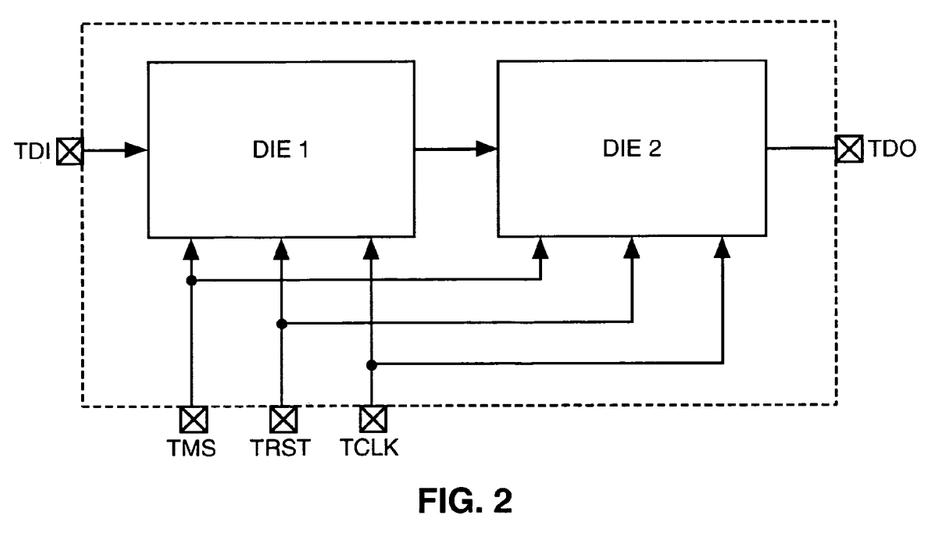
FIG. 2 is a block diagram of a pair of die connected together in series.

In multi-die or multi-device environments, the components could be connected in series, forming a chain (TDO of component 1 is wired to TDI of component 2, and so on), as illustrated in FIG. 2. In this case, the TRST, TMS and TCLK pins are connected to all of the components. Alternatively, the components can be connected in parallel and share the data pins TDI and TDO, but this scheme requires the use of multiple TMS pins.

Disadvantages of the conventional JTAG technology include that in a multi-die package, there may be multiple copies of JTAG IDs in one packaged device, leading to user and/or test equipment confusion. There may also be longer data latency through the device. Furthermore, the JTAG behavior of N cascaded 1-die devices is the same as that of an N-die device. This fact, coupled with a lack of JTAG ID uniqueness for multi-die devices, can cause problems during test and manufacturing.

It would be desirable to have a solution where devices having multiple die in a boundary scan or JTAG chain have a unique device ID. It would also be desirable for the multi-die device to behave as a single die component from the JTAG interface viewpoint.

SUMMARY OF INVENTION

A test system that overcomes these and other problems has a JTAG controller in each die. A master/slave signal is coupled to each one of the controllers. A package may house a number of die elements. A number of boundary scan registers may be controlled by a number of JTAG controllers. A die ID input may be coupled to each one of the JTAG circuits. One of the JTAG controllers may be a master. All but one of the JTAG controllers are slave controllers. A boundary scan register of a first die may be coupled to a boundary scan register of a second device to form a larger scan chain.

In one embodiment, a test system has a number of die in a package. There is a JTAG controller for each of the die. There is a die ID input for the JTAG circuits. Each of the die may have a boundary scan register. There may be a boundary scan register link between at least two of the die. Each of the JTAG controllers may have a master/slave input. One of the JTAG controllers may be selected as a master controller. A test data out pin may only be active for the master controller. Test data in a boundary scan register of a slave controller die may be transferred to a boundary scan register of the master controller die.

In one embodiment, a test system has a package containing a number of die. There is a JTAG controller for each of the die. There is also a master/slave selector input for each of the JTAG controllers. There may be boundary scan register link between at least two of the die. A die ID input may be provided for each of the die. One of the JTAG controllers may be a master controller. All but one of the JTAG controllers may be a slave controller. A test data output pin may only be active for the master controller.

DETAILED DESCRIPTION OF THE DRAWINGS

The present invention relates to JTAG test systems. JTAG test systems are used to test interconnects between integrated circuits (IC). The JTAG specification defines circuitry that is placed on the die with the core logic to facilitate the testing of the IC. These circuits include the boundary scan registers (BSR), the Test Access Port (TAP) controller, the test data input port (TDI), the test data output port (TDO) and the output multiplexer. In addition, a bypass register is used and various control signals are supported, such as the TCLK (test clock), TRST (test reset) and TMS (test status). The present invention adds the signals of master/slave and die ID and a BSR external interconnect between dies. This allows a JTAG system to test multi-die packages easily and efficiently. It also allows for correct identification of the device being tested.

Figure 3A:
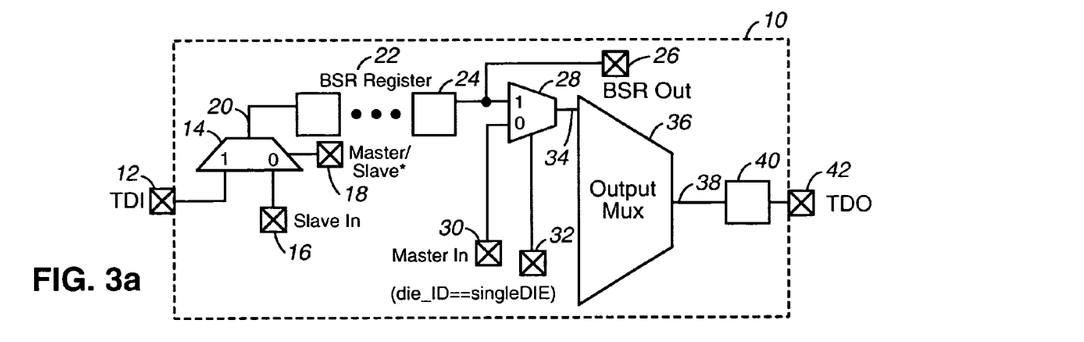
FIGS. 3*a-d* are block diagrams of a test system and how it is configured in accordance with one embodiment of the invention.

FIGS. 3*a-d* are block diagrams of test system and how it is configure in accordance with one embodiment of the invention. FIG. 3*a* shows the general test system 10 configuration. A test data in (TDI) input 12 is coupled to a switch 14. A "slave in" port 16 is also coupled to the controllable switch 14. A "master/slave" port 18 controls the setup of the switch 14. The output 20 of the switch 14 is coupled to the BSR (boundary scan register) 22. The output register 24 is coupled to a BSR (boundary scan register) out port 26 and to a controllable switch 28. A "master in" port 30 is also coupled to the switch 28. A "single die" port 32 controls switch 28. The output 34 of the controllable switch 28 is coupled to an output multiplexer 36. The output 38 of the output multiplexer 36 is coupled to a flip-flop 40 and the output of the flip-flop 40 is coupled to TDO (test data output) port 42.

Figure 3B:
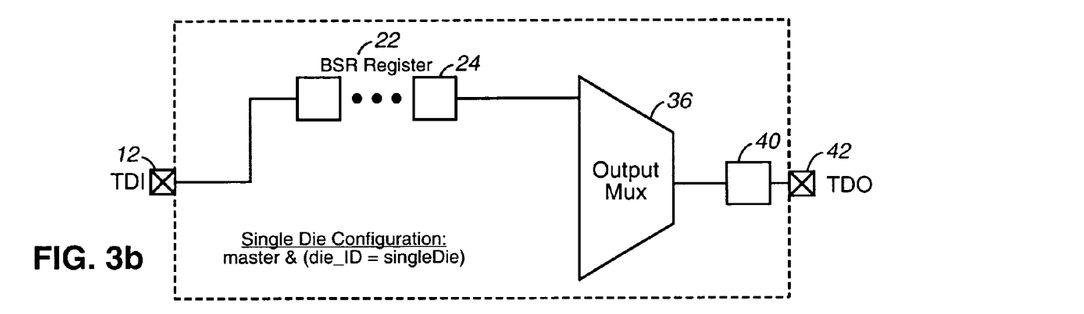

FIG. 3b illustrates how the architecture of the test system 10 of FIG. 3a is configured for a single die system. In this case the master/slave switch 14 has been setup for a master setup and the TDI (Test Data Input) port 12 is coupled to the BSR (boundary scan register) 22. The controllable switch 28 is configured for a single die and the output BSR register 24 is coupled to the output multiplexer 36. This configuration is fairly standard for a JTAG device.

Figure 3C:
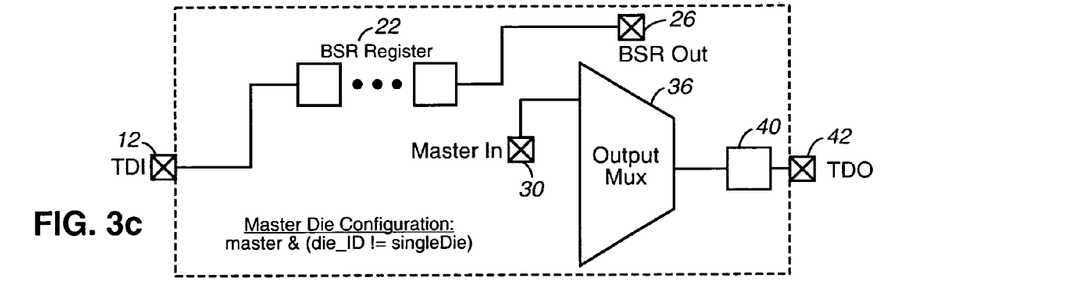

FIG. 3c illustrates how the architecture of the test system 10 of FIG. 3a is configured for a master die in a multi-die configuration. In this case the master/slave switch 14 has been setup for a master setup and the TDI (Test Data Input) port 12 is coupled to the BSR (boundary scan register) 22. The controllable switch 28 is configured for multiple die and the output BSR register 24 is coupled to the BSR out port 26. The "master in" port 30 is coupled to the output multiplexer 36.

Figure 3D:
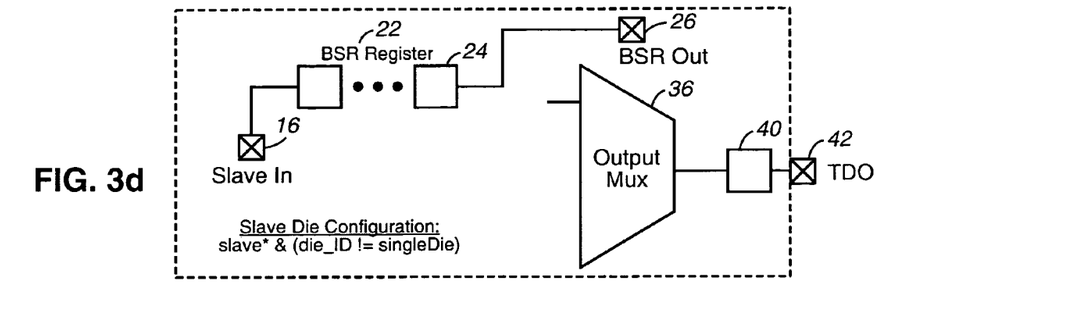

FIG. 3d illustrates how the architecture of the test system 10 of FIG. 3a is configured for a slave die in a multi-die configuration. In this case the master/slave switch 14 has been setup for a slave setup and the "slave in" port 16 is coupled to the BSR (boundary scan register) 22. The output BSR register 24 is coupled to the BSR out port 26. The "master in" port 30 is coupled to the output multiplexer 36.

Figure 4A:
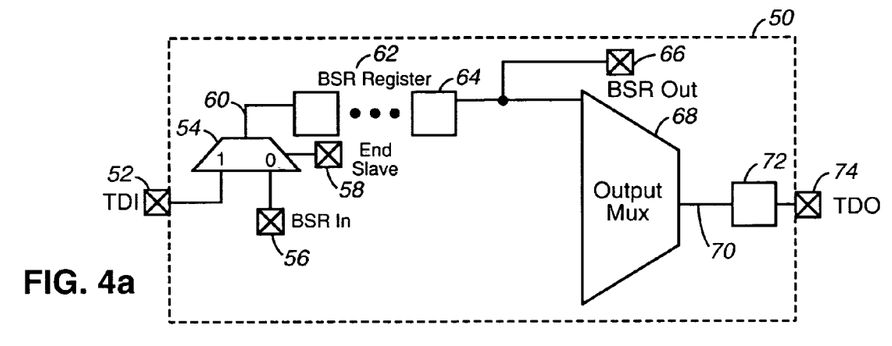
FIGS. 4*a-d* are block diagrams of a test system and how it is configured in accordance with one embodiment of the invention.

FIGS. 4a-d are block diagrams of test system 50 and how it is configure in accordance with one embodiment of the invention. FIG. 4a shows the general test system 50 configuration. A test data in (TDI) input 52 is coupled to a switch 54. A "BSR in" port 56 is also coupled to the controllable switch 54. An "end slave" port 58 controls the setup of the switch 54. The output 60 of the switch 54 is coupled the BSR (boundary scan register) 62. The output register 64 is coupled to a BSR (boundary scan register) out port 66 and to output multiplexer 68. The output 70 of the output multiplexer 66 is coupled to a flip-flop 72 and the output of the flip-flop 72 is coupled to TDO (test data output) port 74.

Figure 4B:
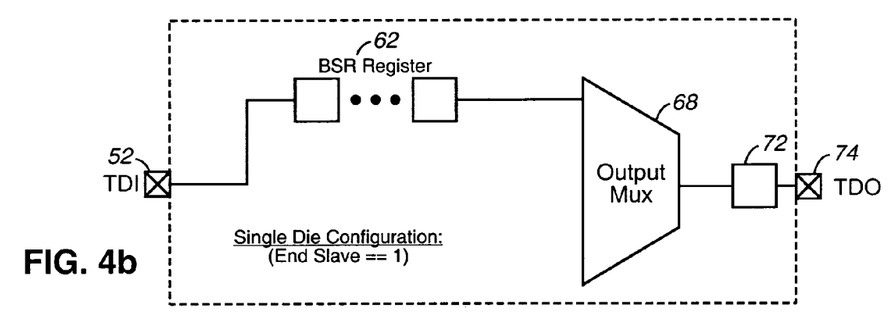

FIG. 4b illustrates how the architecture of the test system 50 of FIG. 4a is configured for a single die system. In this case the end slave switch 54 has been setup for an end slave and the TDI (Test Data Input) port 52 is coupled to the BSR (boundary scan register) 62. This configuration is fairly standard for a JTAG device.

Figure 4C:
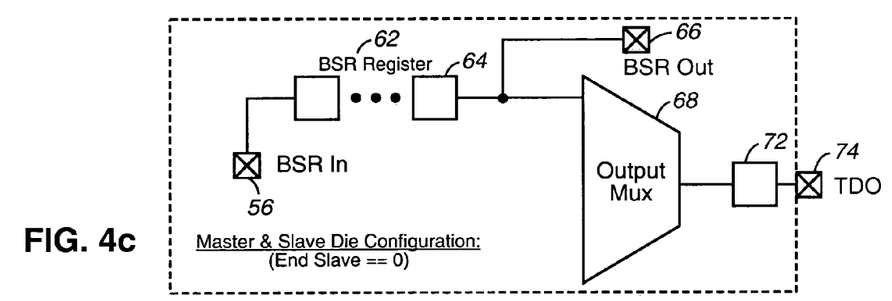

FIG. 4c illustrates how the architecture of the test system 50 of FIG. 4a is configured for a master or slave die configuration. In this case the end slave switch 44 has been setup for a not end slave setup and BSR In port 56 is coupled to the BSR (boundary scan register) 62.

Figure 4D:
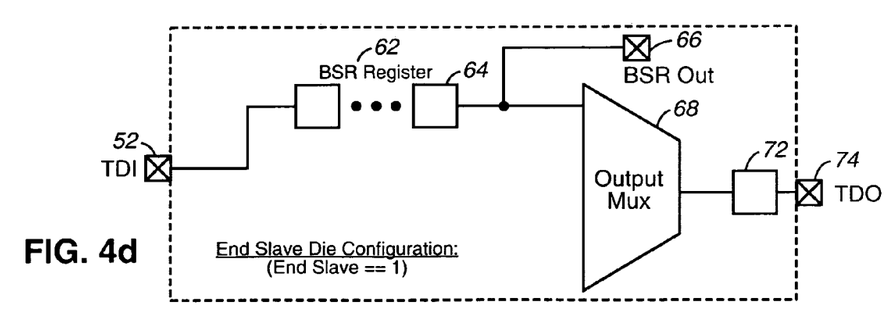

FIG. 4d illustrates how the architecture of the test system 50 of FIG. 4a is configured for an end slave die configuration. In this case the end slave switch 44 has been setup for an end slave setup and TDI port 52 is coupled to the BSR (boundary scan register) 62. The output register 64 is coupled to the BSR Out port 66.

Figure 5:
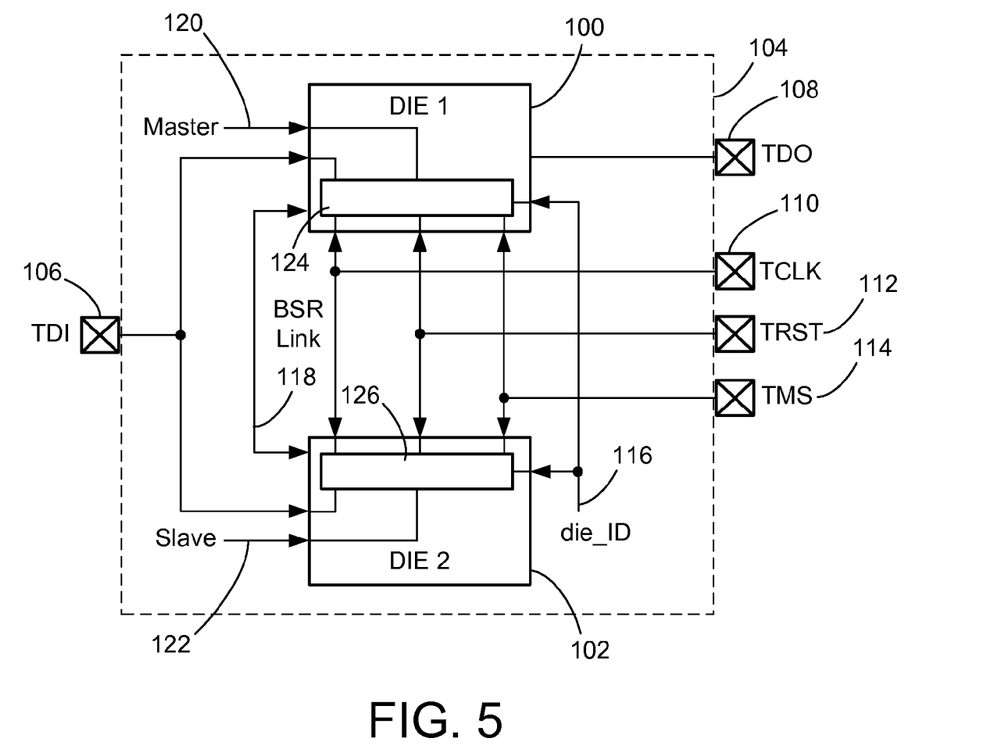
FIG. 5 is a block diagram of a pair of die connected in accordance with one embodiment of the invention.

FIG. 5 is a block diagram of a pair of JTAG devices 100, 102 connected in accordance with one embodiment of the invention. The JTAG devices 100, 102, including JTAG controllers 124, 126 respectively, are contained in a single package 104. The package 104 has a single test data in (TDI) port 106. The package 104 also has a single test data out (TDO) port 108. A single set of JTAG signal inputs: Test clock (TCLK) 110, Test reset (TRST) 112, and Test status (TMS) 114 are provided for the package 104. An internal die ID signal input 116 is coupled to both die 100 and die 102. An internal boundary scan register link 118 couples die 100 to die 102. Both die 100, 102 have a master/slave input 120, 122. In this case the die 100 has been selected as the master.

Figure 6:
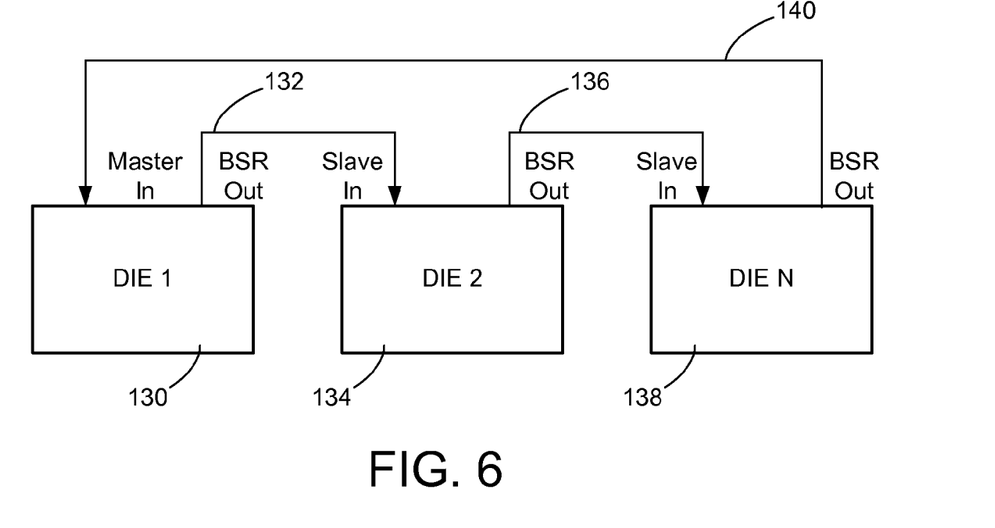
FIG. 6 is a block diagram of multiple die connected in accordance with one embodiment of the invention.

FIG. 6 is a block diagram of multiple JTAG devices connected in parallel in accordance with one embodiment of the invention. In this case "N" die are connected together from a JTAG testing point of view. The standard set of JTAG signal inputs: Test clock (TCLK), Test reset (TRST), and Test status (TMS) are provided for the package and are not shown. Die1 130 is the master die and has a boundary scan register link 132 that shifts data to slave die2 134. A series of similar boundary scan register links 136 shift data to the last slave dieN 138. A boundary scan register link 140 then shifts the data to the master die1 130.

Figure 7:
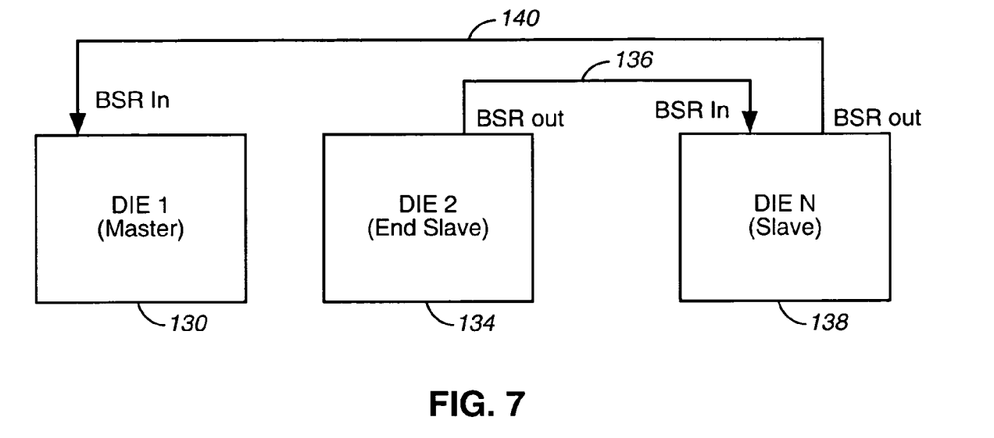
FIG. 7 is a block diagram of multiple die connected in accordance with one embodiment of the invention.

FIG. 7 is a block diagram of multiple JTAG devices connected in parallel in accordance with one embodiment of the invention. This topology is similar to that shown in FIG. 6 except that the link 132 has been removed. Thus all output data is shifted from the end slave die2 134 through the chain of slave dies to the master die1 130 for output on the TDO (test data out) port (not shown).

Figure 8:
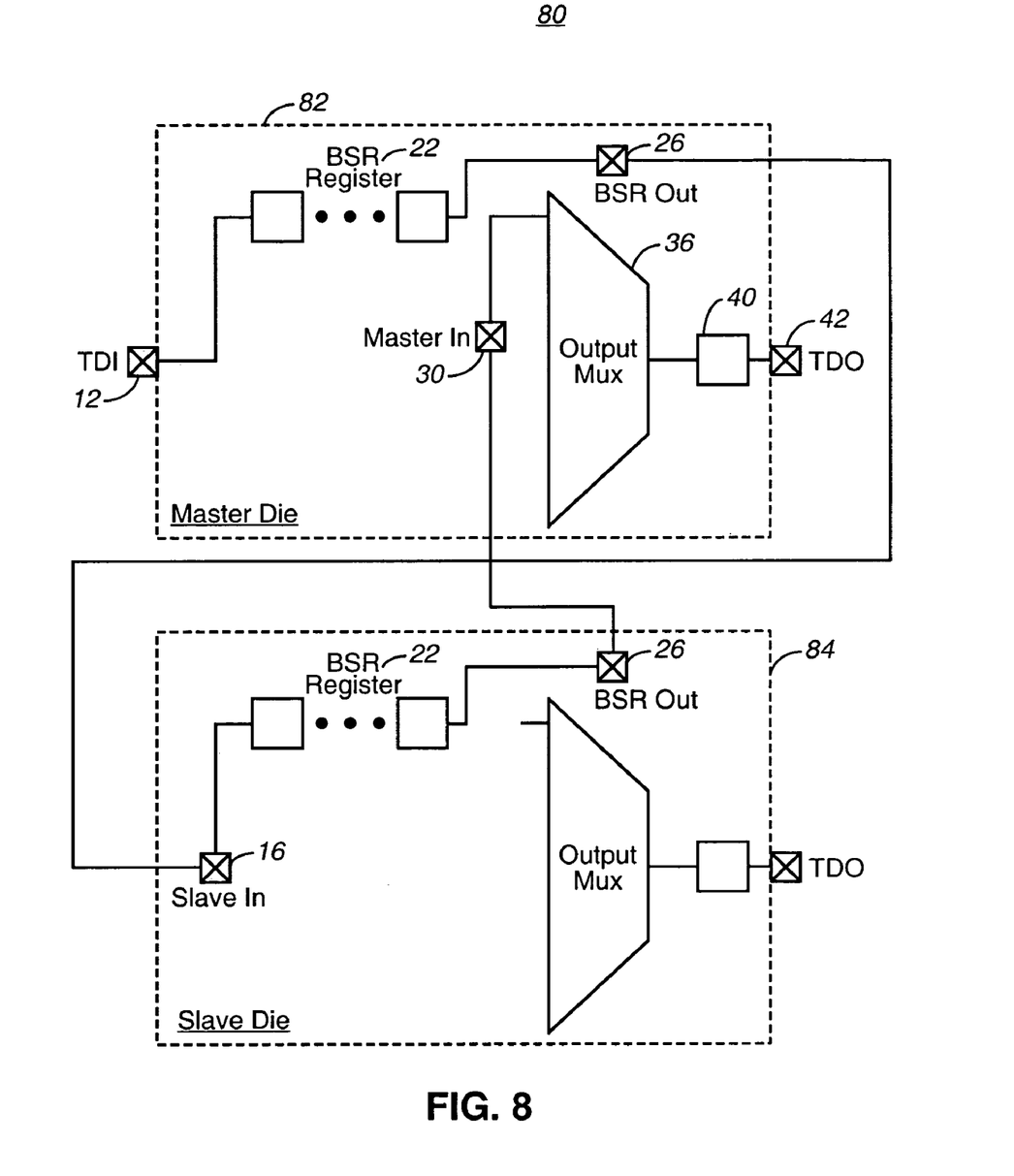
FIG. 8 is an example of a multiple die test system using the test system of FIG. 3 in accordance with one embodiment of the invention.

FIG. 8 is an example of a multiple die test system using the test system of FIG. 3 in accordance with one embodiment of the invention. The top die 82 is configured as a master die as shown in FIG. 3c and the lower die 84 is configured as a slave die as shown in FIG. 3d. The BSR Out port 26 of the master die 82 is coupled to the slave in port 16 and the BSR Out port 26 of the slave die 84 is coupled to the master in port 30 of the master die 82. As can be seen the multiple die system functions as a standard JTAG device.

Figure 9:
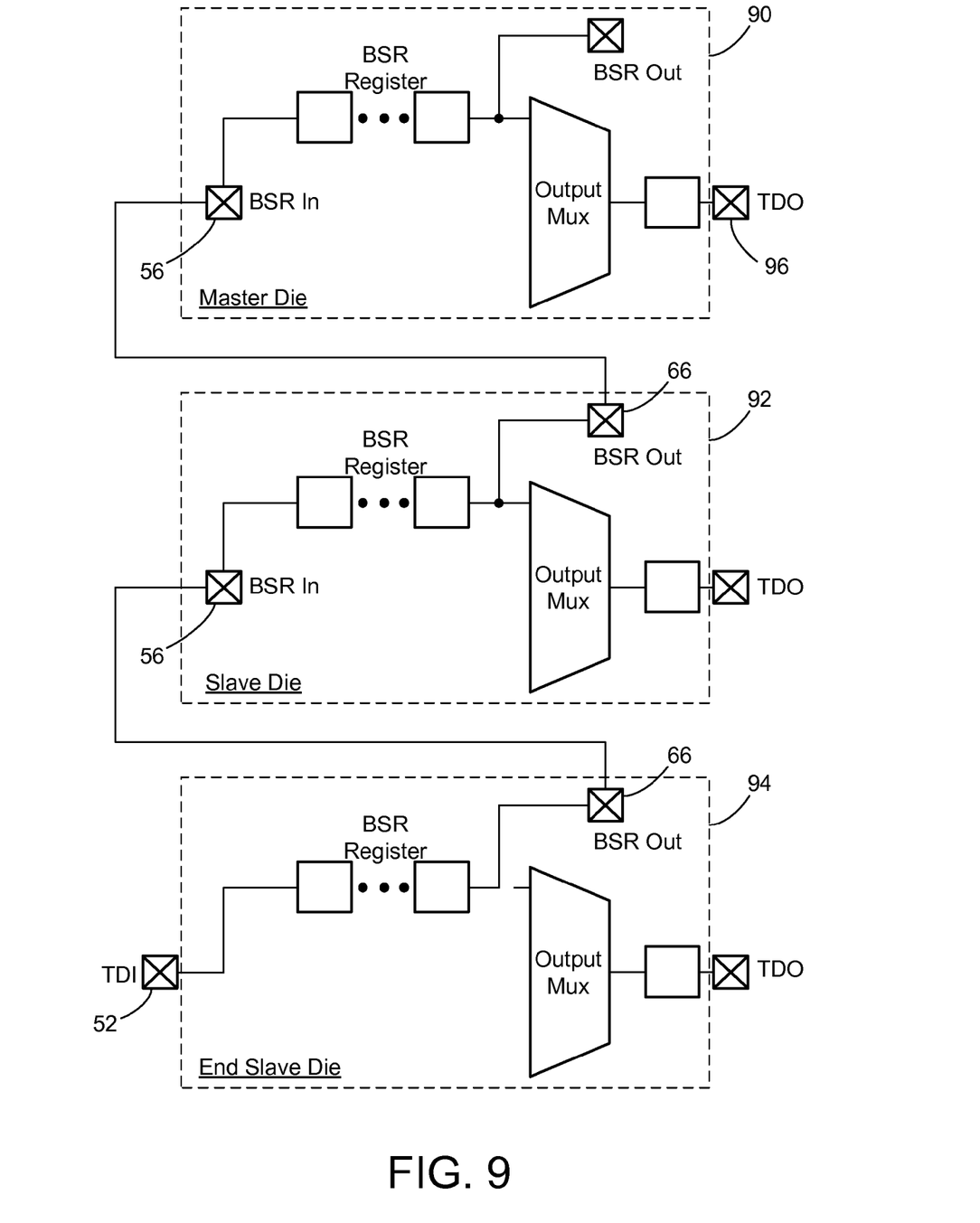
FIG. 9 is an example of a multiple die test system using the test system of FIG. 4 in accordance with one embodiment of the invention.

FIG. 9 is an example of a multiple die test system using the test system of FIG. 4 in accordance with one embodiment of the invention. This system has a master die 90, a slave die 92 and an end slave die 94. The master die 90 is configured as a master die as shown in FIG. 4c. The slave die 92 is configured as shown in FIG. 4c. The end slave die is configured as shown in FIG. 4d. The BSR In 10 port 56 of the master die 90 is coupled to the BSR Out port 66 of the slave die 92. The BSR In port 56 of the slave die 92 is coupled to the BSR Out port 66 of the end slave die 94. The TDI port 52 of the end slave die 94 is active. The TDO port 96 of the master die 90 is active. This clearly illustrates how multiple die JTAG devices can be formed using the test system of FIG. 4.

Note that the multiple die configuration is ideally suited for dies that are all the same.

Thus there has been described a test system that allows a package of multiple die to be treated as a single JTAG device. This speeds up the test processing for multiple die packages and simplifies the test procedures. In addition, each die may now be uniquely defined within the package.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:
1. A test system comprising:
   a plurality of die devices in a multi-die configuration coupled together in a single package, wherein each of the die devices includes a unique die identification (ID); and a selective master/slave control input signal for each of the die devices for configuring each of the plurality of die devices as either a master die device or a slave die device, wherein the master die device comprises a test data output pin activated for presenting test data output for each of the die utilizing a respective unique ID, and wherein the plurality of die devices are connected through one or more boundary scan register links, and wherein signals from the slave die devices are conveyed to the master die device for output via the activated test data output pin.

2. The system of claim 1, wherein each of the plurality of die has a Boundary Scan Register (BSR).

3. The system of claim 2, wherein a test data in a boundary scan register of an individual slave die is transferred to a boundary scan register of the master die device.

4. A multi-die test system comprising:
a plurality of JTAG (Joint Test Action Group) controllers coupled to form a single package, wherein each JTAG controller is associated with a die and each die includes a unique internal die identification (ID);
a master/slave selector input for each of the plurality of JTAG controllers for configuring each of the plurality of JTAG controllers as either a master JTAG controller or a slave JTAG controller, wherein the master JTAG controller comprises a test data output pin activated for presenting test data output for each of the die utilizing a respective die ID wherein the plurality of JTAG controllers are connected through one or more boundary scan register links, and wherein the master JTAG controller receives data from the slave JTAG controllers that includes the unique internal die ID of each die and conveys the data for the package via the activated test data output pin.

5. A test system, comprising:
a plurality of test die, wherein each test die includes a joint test action group (JTAG) controller and wherein each test die is configured to receive an internal die identification (ID) signal that relates to a unique internal die ID for the test die; and,
wherein each JTAG controller of each individual test die is configured to receive a selective master/slave control input signal that configures one JTAG controller as a master JTAG controller, wherein the selective master/slave control input signal configures the remainder JTAG controllers as slave JTAG controllers and wherein test data for the plurality of test die is conveyed to the master JTAG controller via boundary scan register (BSR) linkages between individual test die, wherein the test data includes the unique internal die IDs and wherein the test data is output only from the master JTAG controller via an associated test data output pin.

* * * * *